US008423844B2

(12) United States Patent
Gillis et al.

(10) Patent No.: US 8,423,844 B2
(45) Date of Patent: Apr. 16, 2013

(54) DENSE REGISTER ARRAY FOR ENABLING SCAN OUT OBSERVATION OF BOTH L1 AND L2 LATCHES

(75) Inventors: Pamela S. Gillis, Jericho, VT (US); David E. Lackey, Jericho, VT (US); Steven F. Oakland, Colchester, VT (US); Jeffery H. Oppold, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 13/004,104

(22) Filed: Jan. 11, 2011

(65) Prior Publication Data

US 2012/0179944 A1 Jul. 12, 2012

(51) Int. Cl.
*G01R 31/28* (2006.01)
(52) U.S. Cl.
USPC ............................................. 714/726; 714/30
(58) Field of Classification Search ............ 714/30, 714/726
See application file for complete search history.

(56) References Cited

U.S. PATENT DOCUMENTS

| | | | |
|---|---|---|---|
| 4,710,931 A | 12/1987 | Bellay et al. | |
| 5,210,759 A | 5/1993 | DeWitt et al. | |
| 6,035,262 A | 3/2000 | Gibson et al. | |
| 6,463,561 B1 | 10/2002 | Bhawmik et al. | |
| 6,600,673 B1 | 7/2003 | Croce et al. | |
| 6,834,361 B2 * | 12/2004 | Abbott | 714/42 |
| 7,000,164 B2 * | 2/2006 | Siegel et al. | 714/731 |
| 7,234,090 B2 | 6/2007 | Blasi et al. | |
| 7,404,125 B2 | 7/2008 | Eustis et al. | |
| 7,581,149 B2 | 8/2009 | Sugawara | |
| 7,661,047 B2 | 2/2010 | Rickert et al. | |
| 7,698,613 B2 * | 4/2010 | Kudo | 714/731 |
| 7,710,801 B2 * | 5/2010 | Li | 365/201 |
| 7,855,607 B2 * | 12/2010 | Shimamoto | 331/57 |
| 7,949,916 B1 * | 5/2011 | Ang | 714/726 |
| 7,958,418 B2 * | 6/2011 | Pacha et al. | 714/726 |
| 2009/0217116 A1 | 8/2009 | Motika et al. | |

OTHER PUBLICATIONS

IBM, "LSSD Deterministic Detection of VLSI AC Scan Chain Defects," IP.com, Prior Art Database: Technical Disclosure, IPCOM000179000D, pp. 1-6, Feb. 2009.
IBM, Fiedler, & Lee, "LSSD SRL Analyzer," Ip.com, Prior Art Database: Technical Disclosure, IPCOM000062810D, Jan. 1985.
IBM, "Scan Chain Diagnostics Usin Internal Latch Observations," Ip.com, Prior Art Database: Technical Disclosure, IPCOM000126465D, Jul. 2005.

* cited by examiner

*Primary Examiner* — Esaw Abraham
(74) *Attorney, Agent, or Firm* — Cantor Colburn LLP; Michael LeStrange

(57) ABSTRACT

A scannable register array structure includes a plurality of individual latches, each configured to hold one bit of array data in a normal mode of operation. The plurality of individual latches operate in scannable latch pairs in a test mode of operation, with first latches of the scannable latch pairs comprising L1 latches and second latches of the scannable latch pairs comprising L2 latches. A test clock signal generates a first clock pulse signal, A, for the L1 latches and a second clock pulse signal, B, for the L2 latches. The L2 latches are further configured to selectively receive L1 data therein upon a separate activation of the B clock signal, independent of the test clock signal, such that a scan out operation of the individual latches results in observation of L1 latch data.

14 Claims, 3 Drawing Sheets

DENSE REGISTER ARRAY FOR ENABLING SCAN OUT OBSERVATION OF BOTH L1 AND L2 LATCHES

BACKGROUND

The present invention relates generally to integrated circuit testing techniques and, more particularly, to a dense register array and method for enabling scan out observation of both L1 and L2 latches.

As the packing density of integrated circuit devices has increased greatly in recent years, various schemes have been devised for providing increased testability of the devices. For example, if it is desired to operate an integrated circuit from a known initial state, it is often necessary to be able to input states into the various latches and flip-flops from an external data pin. It is further useful to be able to test the integrated circuit by shifting a test vector comprised of a sequence of bits through a chain of latches and/or flip-flops to ensure the integrated circuit is functioning properly. To this end, the various storage elements have been designed so as to have two modes of operation. In a first mode of operation, the storage elements are set in a "functional" mode such that the integrated circuit performs its normal operational tasks. In a second or "shift" mode, data is shifted through the storage elements and out through an output pin of the integrated circuit for diagnostic analysis.

One particularly effective testing scheme employs a level sensitive scan design (LSSD) in which separate system and scan clocks are used to distinguish between normal and test modes. In particular, latches are used in pairs, wherein each has a normal data input, data output and clock for system operation. In the functional mode, the storage element is a level sensitive latch that is controlled by the system clock. In the shift mode, the two latches form a master/slave pair with one scan input, one scan output, and non-overlapping scan clocks A and B that are held low during system operation but cause the scan data to be latched when pulsed high during scan.

Register arrays that comprise a single latch per memory data bit form a dense memory function. The testing of such register arrays using existing scan techniques (i.e., 2 latches at a time performing 1 scan shift bit) allows the register arrays to fill a window in a memory size versus chip area menu. While smaller memories may be realized with flip-flops (2 latches per memory data bit), larger memories are typically realized by dense arrays of non-scannable memory cells where the memory is tested using Array Built in Self Test (ABIST).

SUMMARY

In one aspect, a scannable register array structure includes a plurality of individual latches, each configured to hold one bit of array data in a normal mode of operation; the plurality of individual latches further configured to operate in scannable latch pairs in a test mode of operation, with first latches of the scannable latch pairs comprising L1 latches and second latches of the scannable latch pairs comprising L2 latches, wherein a test clock signal generates a first clock pulse signal, A, for the L1 latches and a second clock pulse signal, B, for the L2 latches; and the L2 latches are further configured to selectively receive L1 data therein upon a separate activation of the B clock signal, independent of the test clock signal, such that a scan out operation of the individual latches results in observation of L1 latch data.

In another aspect, a method of implementing testing of a scannable register array includes scanning a test pattern into a plurality of individual latches of the register array, each of the latches configured to hold one bit of array data in a normal mode of operation, and configured to operate in scannable latch pairs in a test mode of operation, with first latches of the scannable latch pairs comprising L1 latches and second latches of the scannable latch pairs comprising L2 latches; the scanning comprising using a test clock signal to generate a first clock pulse signal, A, for the L1 latches and a second clock pulse signal, B, for the L2 latches; capturing test data into the plurality of individual latches using a system clock pulse, C, for each of the plurality of latches; and selecting either the L1 latches or the L2 latches for scan out data observation; wherein, for selection of the L1 latches for observation, implementing a separate activation of the B clock signal, independent of the test clock signal, such that L2 latches receive L1 data therein prior to a scan out operation of the individual latches, thereby resulting in observation of L1 latch data.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is a dense, scannable register array of 1 latch per memory bit and associated method of operating the same that allows for the optimum usage window for memory applications to be large, thereby avoiding less optimal flop or BISTed solutions. Such a solution provides the ability to scan for test, in order to avoid BIST overhead. While prior LSSD solutions existed for register arrays (e.g., 45 nanometer (nm) and earlier application specific integrated circuit (ASIC) design systems), the present embodiments provide a novel solution where industry standard mux-scan may be used as the scan/test approach.

As described in further detail below, a particular difficulty for a mux-scan solution is enabling the visibility of both latches of a latch pair. In conventional mux-scanning each latch pair is shifted with each scan cycle, wherein only the L2 latches are normally visible. That is, in each scan cycle a test clock for scan (TCLK) is pulsed where the L1 latches are pulsed on the rising edge of the test clock signal (A) while the L2 latches are pulsed on the falling edge of the test clock signal (B). In essence, the L1/L2 latch pair operates together as a scannable flop that appears to sequence on the rising edge of TCLK, and present data to the register array's scan out pin on the falling edge of TCLK. Thus, a scanout sequence will appear to observe the contents on the L2 latches, but not the unique contents of the L1 latches.

In the embodiments disclosed herein, an additional clock selection is provided for uniquely pulsing the L2 clock which copies the contents of the L1 registers into the L2 registers. In so doing prior to the pattern scan sequence, the special L2 clock (B) is pulsed, which effectively causes the scanned out sequence to observe L1 registers rather than L2 registers.

Therefore, by virtue of a test pattern either selectively (1) provided with the special L2 pulse (B) which results in observation of L1 registers in the scanned out data, or (2) not provided with the special L2 pulse (B) which results in observation of L2 registers in the scanned out data, the total pattern set for all L1 registers and all L2 registers may be observed.

Figure 1:
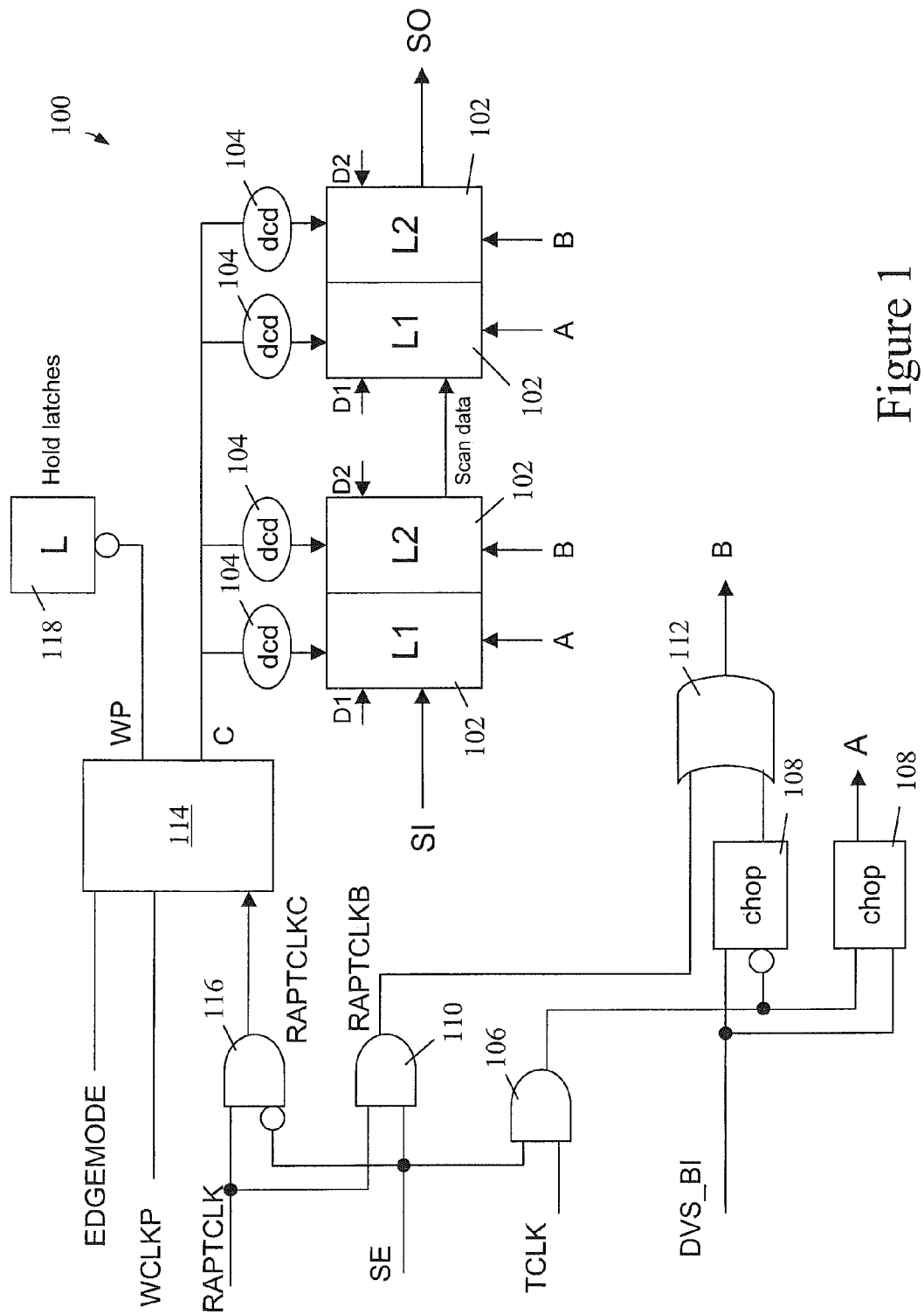
FIG. 1 is a schematic diagram of a dense, scannable register array of 1 latch per memory bit, in accordance with an embodiment of the invention.

Referring initially to FIG. 1, there is shown a schematic diagram of a dense, scannable register array 100 of 1 latch per memory bit, in accordance with an embodiment of the invention. As is shown, the array includes a plurality of individual latches 102 that are arranged in L1/L2 pairs in accordance with LSSD principles. In a normal mode of operation, each individual latch 102 (also referred to as a flip-flop, or flop for short) holds one bit of array data. Although FIG. 1 illustrates two pairs of L1/L2 latches, it will be appreciated in an actual array, there may be hundreds or more of such individual latches 102. Data written into the latches 102 is presented by way of data inputs (e.g., D1, D2) as controlled by the system clock signal C, in combination with address decode circuitry 104.

In a test or scan mode, the latches 102 operate in L1/L2 pairs wherein scan in (SI) test data is captured into the L1 latches upon pulsing of test clock signal A, while scan out (SO) data is read or observed from the L2 latches upon pulsing of test clock signal B. The test clock signal A is derived from the rising edge of test clock signal TCLK, and the test clock B is derived from the falling edge of test clock signal TCLK. A scan enable signal SE gates the test clock signal TCLK using a first AND gate 106. Further, to elongate the pulse of test clock A and test clock B, a pair of clock chopping devices 108, controlled by a signal DVS_BI, receives the gated TCLK signal (in the case of test clock A) and the complement thereof (in the case of test clock B). The outputs of the clock chopping devices 108 represent the test clock A and test clock B signals used during scan in and scan out operation in the test mode.

As indicated above, a conventional register array provides for observation of only the L2 output data upon the falling edge of the test clock signal TCLK (i.e., upon generation of test clock B). However, as further illustrated in FIG. 1, a new register array pulse test clock signal (RAPTCLK) is provided to enable an additional means of pulsing test clock B besides the activation of TCLK. In so doing, the contents of the L1 latches are effectively shifted or copied into the L2 latches such that subsequent scanning/unloading of the test pattern results in observation of the L1 latches. As is the case with test clock signal TCLK, the register array pulse test clock signal RAPTCLK is also gated by the scan enable SE signal through a second AND gate 110, which produces the output signal RATCLKB. Thus, it will be seen that through the use of an OR gate 112, either the test clock signal TCLK or the new register array pulse test clock signal RAPTCLK can cause the L2 latches in the scan chain to be pulsed.

As will be further noted from FIG. 1, the register array pulse test clock signal RAPTCLK is also used in conjunction with the system clock logic 114. Following the unloading of prior test pattern results/loading of new pattern data, the system function is executed to capture the new system bits into the register array. Here, the scan enable SE signal is low, and thus the inverted value thereof gates RAPTCLK into the system clock logic 112 by virtue of a third AND gate 116. The gated output of AND gate 116 is designated as register array pulse test clock C (RAPTCLKC) in FIG. 1, which is an input to the system clock logic 114, along with a write clock pulse signal (WCLKP) and an edge mode clock signal (EDGEMODE). Outputs of the system clock logic 114 include the C clock (which as stated above, pulses new system data into the register array based on the address decode circuitry 104) and an at speed clock signal WP that is coupled to hold latches for stabilizing data received at the chip inputs.

Figure 2:
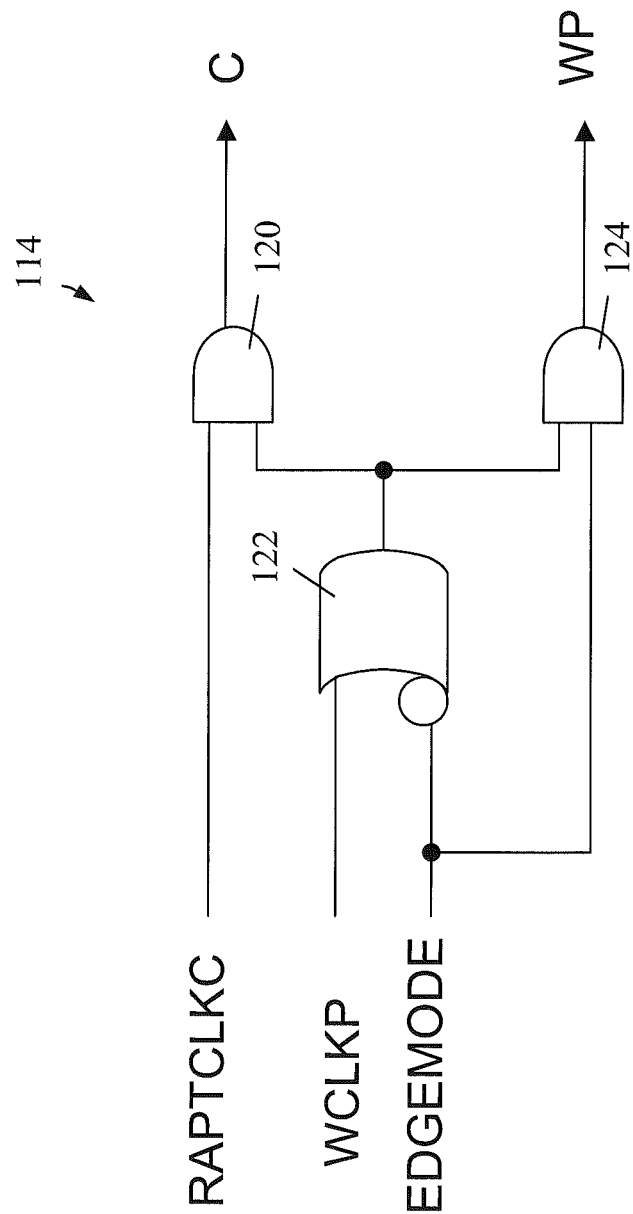
FIG. 2 is a schematic diagram of a portion of the system clock logic shown in FIG. 1.

Although not central to the main operation of the present embodiments, FIG. 2 nonetheless illustrates the system clock logic 114 for completeness. As is shown, the C clock signal is derived from gating of the resister array pulse test clock signal C (RAPTCLKC) via the AND gate 120. This gating of the C clock signal is itself an OR function, by way of OR gate 122, which passes either the system write clock signal WCLKP or the inverted value of the EDGEMODE signal. The at speed clock signal WP used by the hold latches 118 is gated by the EDGEMODE signal through AND gate 124.

Figure 3:
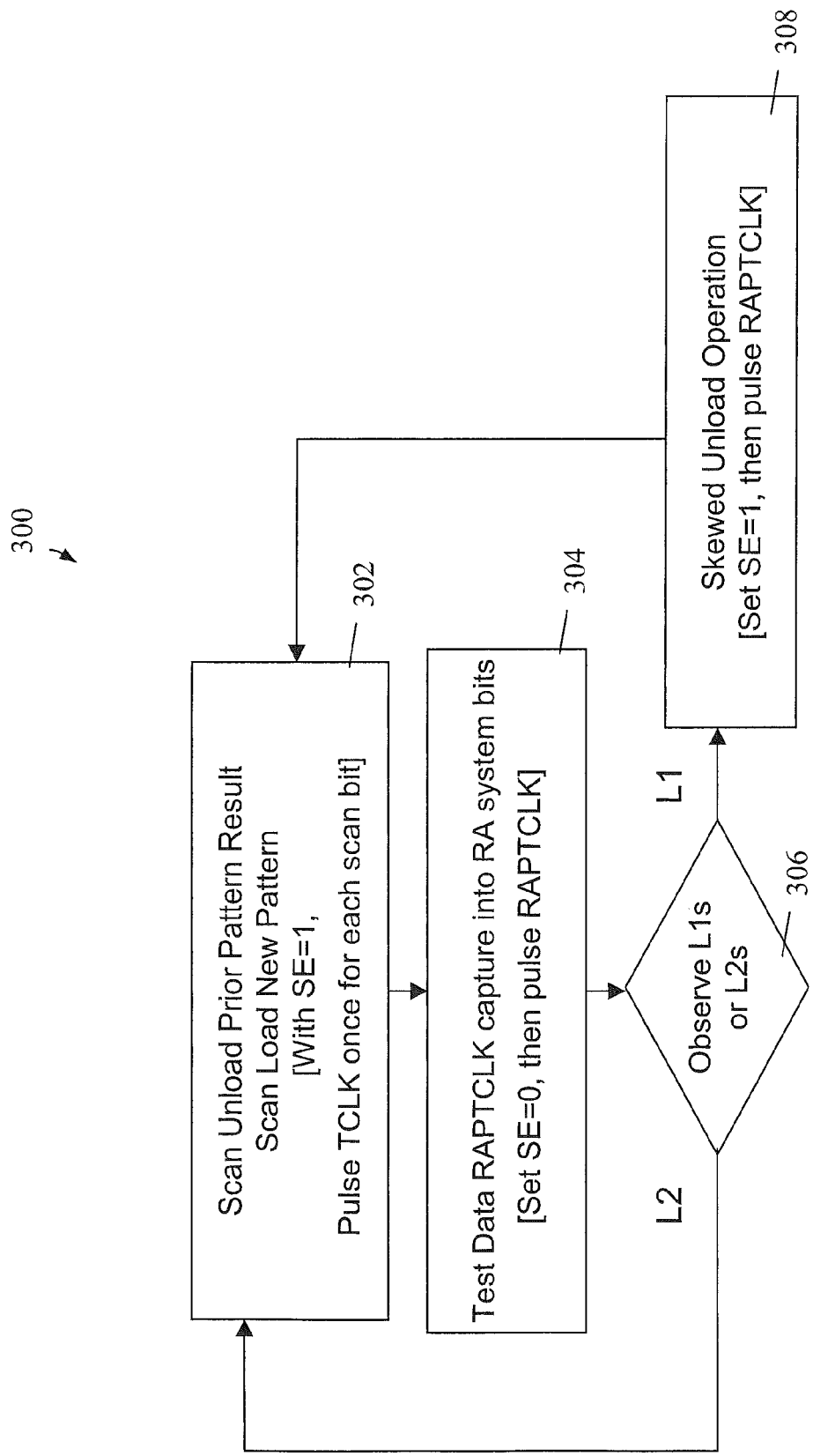
FIG. 3 is a flow diagram illustrating a method of operating the dense, scannable register array of 1 latch per memory bit shown in FIG. 1, in accordance with an embodiment of the invention.

Finally, FIG. 3 is a flow diagram illustrating a method 300 of operating the dense, scannable register array 100 shown in FIG. 1, in accordance with an embodiment of the invention. As shown in block 302, a scan operation is used to unload a prior test pattern result, while also loading a new test pattern into the array latches. In terms of FIG. 1, the scan enable (SE) signal is active high while the test clock signal TCLK is pulsed once for each scan bit of the test pattern. As described earlier, this involves an A clock pulse to each L1 latch on the rising edge of TCLK and a B clock pulse to each L2 latch on the falling edge of TCLK. Then, as shown in block 304 of FIG. 3, the register array system function is executed so as to capture test data into the register array system latches. More specifically, the SE signal of FIG. 1 is held low, while the register array pulse test clock signal RAPTCLK is pulsed. This in turn allows the C clock to facilitate D1 and D2 data capture into the L1 and L2 latches.

Heretofore, this would simply be followed by observation of the data out from the L2 latches during the next scan cycle as new test data is scanned into the L1 latches. However, as reflected in decision block 306, there is now the flexibility of determining whether it is desired to observe either the L1 latch data or the L2 latch data during the next scan in/out operation. HU data is to be observed, then the process 300 proceeds to block 308 where the register array pulse test clock signal RAPTCLK is pulsed so that the contents of the L1 registers are copied or shifted in the L2 registers. In this instance, the SE signal of FIG. 1 is set high, while the register array pulse test clock signal RAPTCLK is pulsed. This results in the "extra" pulse of the B clock coupled to the L2 latches, independent of the test clock signal TCLK.

Then, regardless of whether L1 or L2 data is selected for observation, the process 300 returns to block 302 to unload the results of the prior pattern and load the new test data by activating SE and pulsing TCLK once for each scan bit of the test pattern. As will thus be appreciated, through the use of the new register array pulse test clock signal RAPTCLK designed to uniquely pulse the B clock signal of the L2 latches, the resulting scan out sequence provides observation of L1 data through the one-time shift into the L2 latches. In this manner, the total pattern set for all of the L1 and L2 latches are observable.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A scannable register array structure, comprising:
a plurality of individual latches, each configured to hold one bit of array data in a normal mode of operation;
the plurality of individual latches further configured to operate in scannable latch pairs in a test mode of operation, with first latches of the scannable latch pairs comprising L1 latches and second latches of the scannable latch pairs comprising L2 latches, wherein a test clock signal generates a first clock pulse signal, A, for the L1 latches and a second clock pulse signal, B, for the L2 latches; and
the L2 latches are further configured to selectively receive L1 data therein upon a separate activation of the B clock signal, independent of the test clock signal, such that a scan out operation of the individual latches results in observation of L1 latch data.

2. The scannable register array structure of claim 1, wherein the separate activation of the B clock signal is generated by a register array pulse test clock signal.

3. The scannable register array structure of claim 2, further comprising an OR gate having a gated version of the register array pulse test clock signal as a first input thereto, and a chopped clock signal triggered by a falling edge of the test clock signal as a second input thereto, with an output of the OR gate comprising the B clock signal for the L2 latches.

4. The scannable register array structure of claim 2, wherein both the test clock signal and the register array pulse test clock signal are gated by a scan enable signal.

5. The scannable register array structure of claim 4, further comprising system clock logic configured to generate a system clock pulse, C, for each of the plurality of latches to execute a register array function and capture test result data therein.

6. The scannable register array structure of claim 5, wherein the system clock pulse C is also generated by the register array pulse test clock signal.

7. The scannable register array structure of claim 6, wherein the separate activation of the B clock signal is generated by the register array pulse test clock signal with the scan enable signal active, and the system clock pulse C is generated by the register array pulse test clock signal with the scan enable signal inactive.

8. A method of implementing testing of a scannable register array, the method comprising:
scanning a test pattern into a plurality of individual latches of the register array, each of the latches configured to hold one bit of array data in a normal mode of operation, and configured to operate in scannable latch pairs in a test mode of operation, with first latches of the scannable latch pairs comprising L1 latches and second latches of the scannable latch pairs comprising L2 latches;
the scanning comprising using a test clock signal to generate a first clock pulse signal, A, for the L1 latches and a second clock pulse signal, B, for the L2 latches;
capturing test data into the plurality of individual latches using a system clock pulse, C, for each of the plurality of latches; and
selecting either the L1 latches or the L2 latches for scan out data observation;
wherein, for selection of the L1 latches for observation, implementing a separate activation of the B clock signal, independent of the test clock signal, such that L2 latches receive L1 data therein prior to a scan out operation of the individual latches, thereby resulting in observation of L1 latch data.

9. The method of claim 8, wherein the separate activation of the B clock signal is generated by a register array pulse test clock signal.

10. The method of claim 2, further comprising configuring an OR gate to have a gated version of the register array pulse test clock signal as a first input thereto, and a chopped clock signal triggered by a falling edge of the test clock signal as a second input thereto, with an output of the OR gate comprising the B clock signal for the L2 latches.

11. The method of claim 9, wherein both the test clock signal and the register array pulse test clock signal are gated by a scan enable signal.

12. The method of claim 11, further comprising generating, using system clock logic, a system clock pulse, C, for each of the plurality of latches to execute a register array function and capture test result data therein.

13. The method of claim 12, wherein the system clock pulse C is also generated by the register array pulse test clock signal.

14. The method of claim 13, wherein the separate activation of the B clock signal is generated by the register array pulse test clock signal with the scan enable signal active, and the system clock pulse C is generated by the register array pulse test clock signal with the scan enable signal inactive.

* * * * *